(12) United States Patent
Yamashita et al.

(10) Patent No.: US 9,406,796 B2
(45) Date of Patent: Aug. 2, 2016

(54) SEMICONDUCTOR DEVICE

(71) Applicant: Panasonic Intellectual Property Management Co., Ltd., Osaka (JP)

(72) Inventors: Katsushige Yamashita, Osaka (JP); Shigetaka Aoki, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/970,068

(22) Filed: Dec. 15, 2015

(65) Prior Publication Data
US 2016/0104795 A1 Apr. 14, 2016

Related U.S. Application Data

(63) Continuation of application No. PCT/JP2014/003527, filed on Jul. 2, 2014.

(30) Foreign Application Priority Data

Jul. 11, 2013 (JP) .................................. 2013-145211

(51) Int. Cl.
| | |
|---|---|
| H01L 29/66 | (2006.01) |
| H01L 29/78 | (2006.01) |
| H01L 29/423 | (2006.01) |
| H01L 29/10 | (2006.01) |
| H01L 29/49 | (2006.01) |

(52) U.S. Cl.
CPC ........ *H01L 29/7813* (2013.01); *H01L 29/1095* (2013.01); *H01L 29/4236* (2013.01); *H01L 29/4916* (2013.01)

(58) Field of Classification Search
CPC ............ H01L 29/7813; H01L 29/1095; H01L 29/4236; H01L 29/4916; H01L 29/42356; H01L 29/66734; H01L 29/7397
See application file for complete search history.

(56) References Cited

U.S. PATENT DOCUMENTS

| | | | | |
|---|---|---|---|---|
| 2003/0201483 | A1* | 10/2003 | Sumida | ............... H01L 29/0634 257/302 |
| 2004/0031987 | A1* | 2/2004 | Henninger | ............ H01L 29/407 257/328 |
| 2005/0167742 | A1* | 8/2005 | Challa | ................. H01L 21/3065 257/328 |
| 2008/0048255 | A1 | 2/2008 | Ishida et al. | |
| 2009/0309156 | A1* | 12/2009 | Darwish | ........... H01L 29/41766 257/332 |
| 2013/0069056 | A1 | 3/2013 | Takemura | |

FOREIGN PATENT DOCUMENTS

| | | |
|---|---|---|
| JP | 61-059666 B | 12/1986 |
| JP | 1-238067 | 9/1989 |
| JP | 2002-270841 | 9/2002 |
| JP | 2003-324196 | 11/2003 |
| JP | 2008-053378 | 3/2008 |
| JP | 2013/062461 | 4/2013 |

OTHER PUBLICATIONS

International Search Report of PCT application No. PCT/JP2014/003527 dated Oct. 7, 2014.

* cited by examiner

*Primary Examiner* — Khiem D Nguyen
(74) *Attorney, Agent, or Firm* — McDermott Will & Emery LLP

(57) ABSTRACT

A semiconductor device includes a second conductivity type back gate electrode formed within a body area, and electrically connected with the body area, and performs bidirectional current control in a direction from a drain area to a source area and in a direction from the source area to the drain area. A sheet resistance of the back gate electrode is lower than a sheet resistance of the body area. The source area and the back gate electrode are disposed apart from each other with a clearance sufficient for preventing a breakdown phenomenon caused between the source area and the back gate electrode when a maximum operation voltage is applied between the source area and the drain area.

12 Claims, 15 Drawing Sheets

SEMICONDUCTOR DEVICE

RELATED APPLICATIONS

This application is a Continuation of International Application No. PCT/JP2014/003527, filed on Jul. 2, 2014, which in turn claims priority from Japanese Patent Application No. 2013-145211, filed on Jul. 11, 2013, the contents of all of which are incorporated herein by reference in their entireties.

BACKGROUND

1. Field of the Invention

The present disclosure relates to a semiconductor device.

2. Description of the Related Art

A lithium-ion battery includes a charge and discharge protection device within a battery pack for preventing over-charge and over-discharge of a battery cell, as well as the battery cell provided within the battery pack in order to protect the battery from over-charge and over-discharge. This charge and discharge protection device includes a bidirectional switch, and thus needs ON-OFF control for each of bidirectional currents. Accordingly, the charge and discharge protection device is generally constituted by two power MOSFETs (Metal Oxide Semiconductor Field Effect Transistors).

According to this type of charge and discharge protection device equipped with two power MOSFETs, under a first condition, a positive voltage with respect to a source of a first MOSFET is applied to a gate of the first MOSFET to produce an ON-state between a drain and the source of the first MOSFET and allow a function of a diode by a second MOSFET. As a result, a current flows from a source of the second MOSFET to the source of the first MOSFET. Under a second condition, a positive voltage with respect to the source of the second MOSFET is applied to a gate of the second MOSFET to produce an ON-state between a drain and the source of the second MOSFET and allow a function of a diode by the first MOSFET. As a result, a current flows from the source of the first MOSFET to the source of the second MOSFET. Bidirectional currents are controllable based on the foregoing operations. However, the structure equipped with two power MOSFETs as noted above is difficult to meet a demand for size reduction of a cellular phone or other devices.

For example, a semiconductor device disclosed in Unexamined Japanese Patent Publication No. 2008-53378 developed to overcome this problem includes a source area formed throughout a surface of an operation area, a first back gate area formed between trenches and below the source area, a second back gate area formed out of the source area and connected with the first back gate area, a first electrode layer contacting the source area and formed throughout the surface of the operation area, and a second electrode layer contacting the second back gate area and formed on an outer periphery of the first electrode layer. This structure is capable of applying a voltage separately to the first electrode layer and the second electrode layer, and therefore needs only one power MOSFET for bidirectional current control.

Unexamined Japanese Patent Publication No. 2008-53378 adopts ion implantation as a method for forming the first back gate electrode, while Unexamined Japanese Patent Publication No. 2002-270841 discloses a method using doped polysilicon for formation of the electrode.

SUMMARY

A semiconductor device according to the present disclosure includes: a first conductivity type semiconductor substrate to be a drain area; a drift area formed on the drain area; a second conductivity type body area formed on an upper portion of the drift area; a first conductivity type source area formed on an upper portion of the body area; a trench that penetrates the source area and the body area, and reaches the drift area; an insulation film formed on an inner wall of the trench; a gate electrode formed inside the insulation film; and a second conductivity type back gate electrode formed inside the body area and electrically connected with the body area. A current flows from the drain area to the source area in a state where a first voltage is applied to the drain area, a second voltage lower than the first voltage is applied to the source area and the body area, and a third voltage equal to or higher than a first threshold is applied between the gate electrode and the source area. A current flows from the source area to the drain area in a state where the first voltage is applied to the source area, the second voltage is applied to the drain area and the body area, and a fourth voltage equal to or higher than a second threshold is applied between the gate electrode and the drain area. A sheet resistance of the back gate electrode is lower than a sheet resistance of the body area. The source area and the back gate electrode are disposed apart from each other with a clearance sufficient for preventing a breakdown phenomenon caused between the source area and the back gate electrode when a maximum operation voltage is applied between the source area and the drain area. According to this structure, the semiconductor device has a preferable bidirectional breakdown voltage.

According to the semiconductor device of the present disclosure, the source electrode and the back gate electrode are disposed at positions not adjacent to each other. Accordingly, bidirectional control is achievable by using a single transistor, and reduction of an ON resistance of a MOSFET is realizable.

DETAILED DESCRIPTION OF THE PREFERRED EMBODIMENTS

The semiconductor device disclosed in Unexamined Japanese Patent Publication No. 2008-53378 includes the first back gate area between the trenches and below the source area. In this case, the source area and the first back gate area are disposed adjacent to each other. When a positive voltage with respect to the drain is applied to the source, this voltage is applied to the source area and the first back gate area. In this case, breakdown in excess of a withstand voltage may be caused at a low voltage.

According to the semiconductor device disclosed in Unexamined Japanese Patent Publication No. 2002-270841, electric conduction between a source area and a first back gate area is established. When a positive voltage with respect to a drain is applied to a source in this condition, a function as a diode operates in accordance with application of this voltage. In this case, bidirectional current control is difficult to achieve. The charge and discharge protection device performing bidirectional current control requires a bidirectional breakdown voltage.

A semiconductor device according to the present disclosure is hereinafter described with reference to the drawings. In the following description, some details may not be particularly touched upon. For example, detailed explanation of well-known matters, or repeated explanation of substantially identical configurations may not be given. These omissions are made for avoiding unnecessary redundancy of the following description, and helping easy understanding of the present disclosure by those skilled in the art.

The accompanying drawings and the following description are presented not for the purpose of setting any limitations to subject matters defined in the appended claims, but only for the purpose of helping those skilled in the art fully understand the present disclosure.

First Exemplary Embodiment

A semiconductor device according to a first exemplary embodiment is hereinafter described with reference to FIGS. 1 through 7B.

Discussed in this exemplary embodiment is an N-channel type vertical gate semiconductor device embodying the present disclosure. According to this example, a first conductivity type in the present disclosure corresponds to N type, while a second conductivity type corresponds to P type. The following description is applicable to a P-channel type vertical gate semiconductor device as well when conductivity types of respective impurity areas within the element are reversed.

Figure 1:
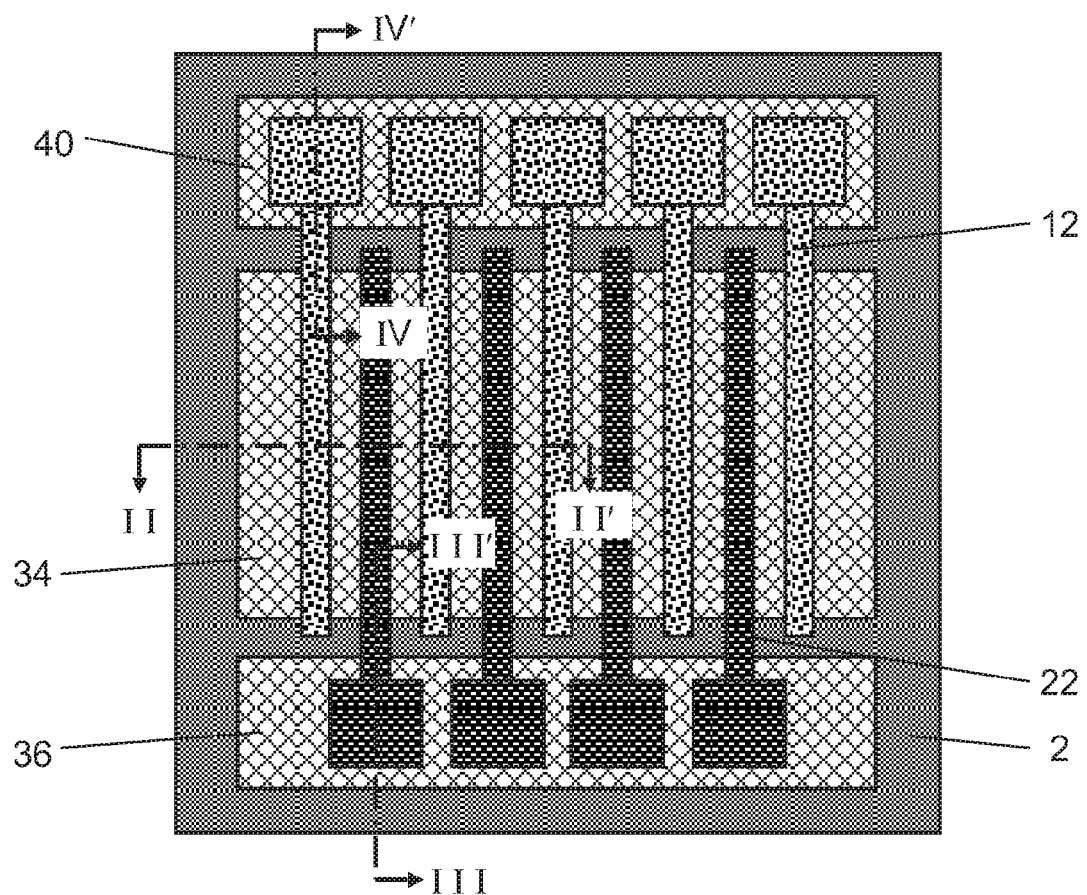
FIG. 1 is a plan view illustrating a configuration of a semiconductor device according to a first exemplary embodiment.
Figure 2:
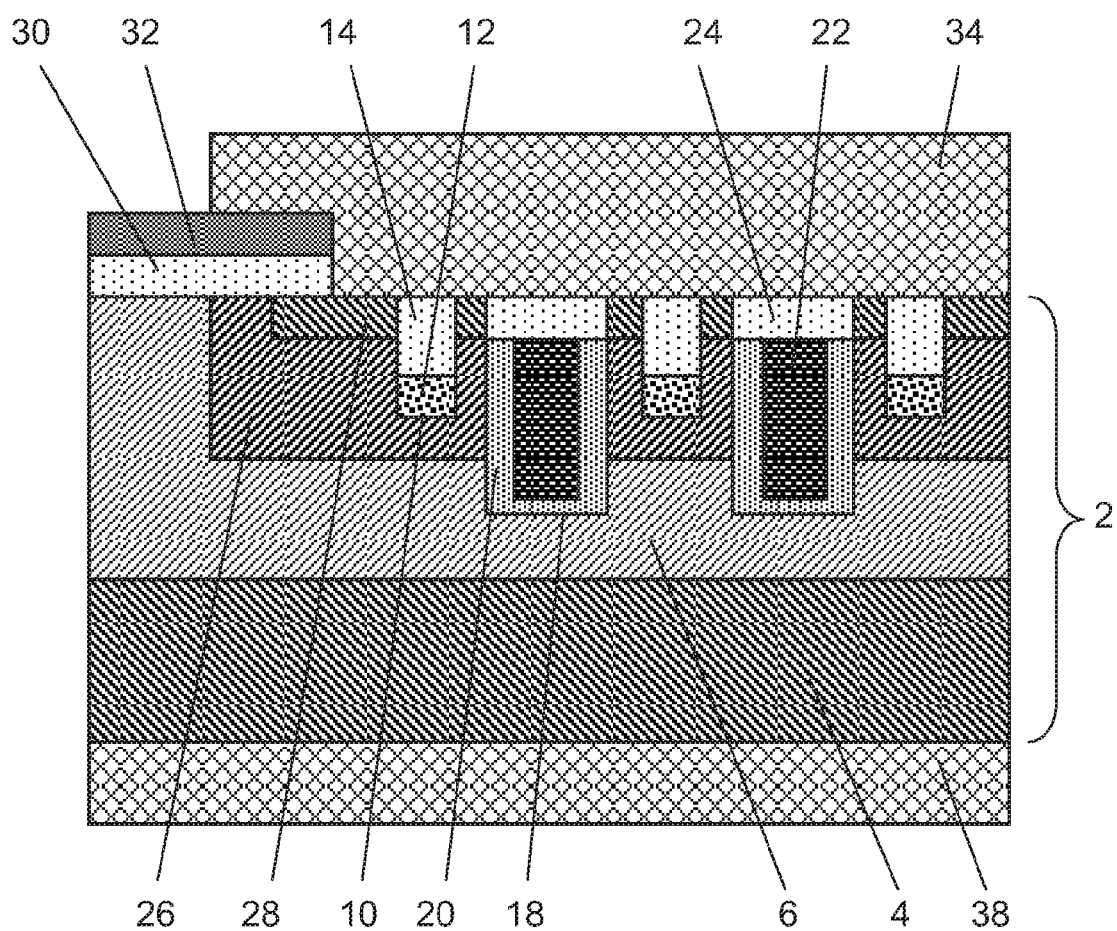
FIG. 2 is a cross-sectional view taken along line II-IF in FIG. 1.
Figure 3:
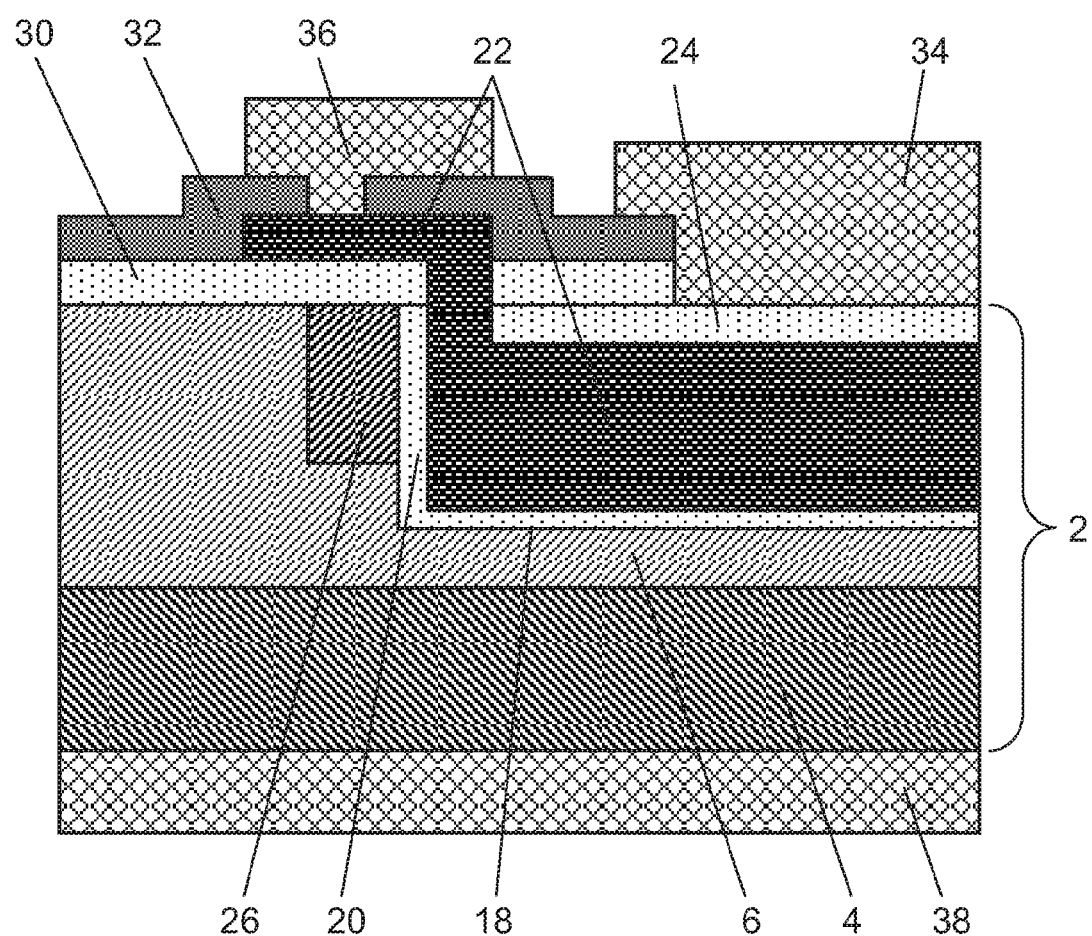
FIG. 3 is a cross-sectional view taken along line III-III' in FIG. 1.
Figure 4:
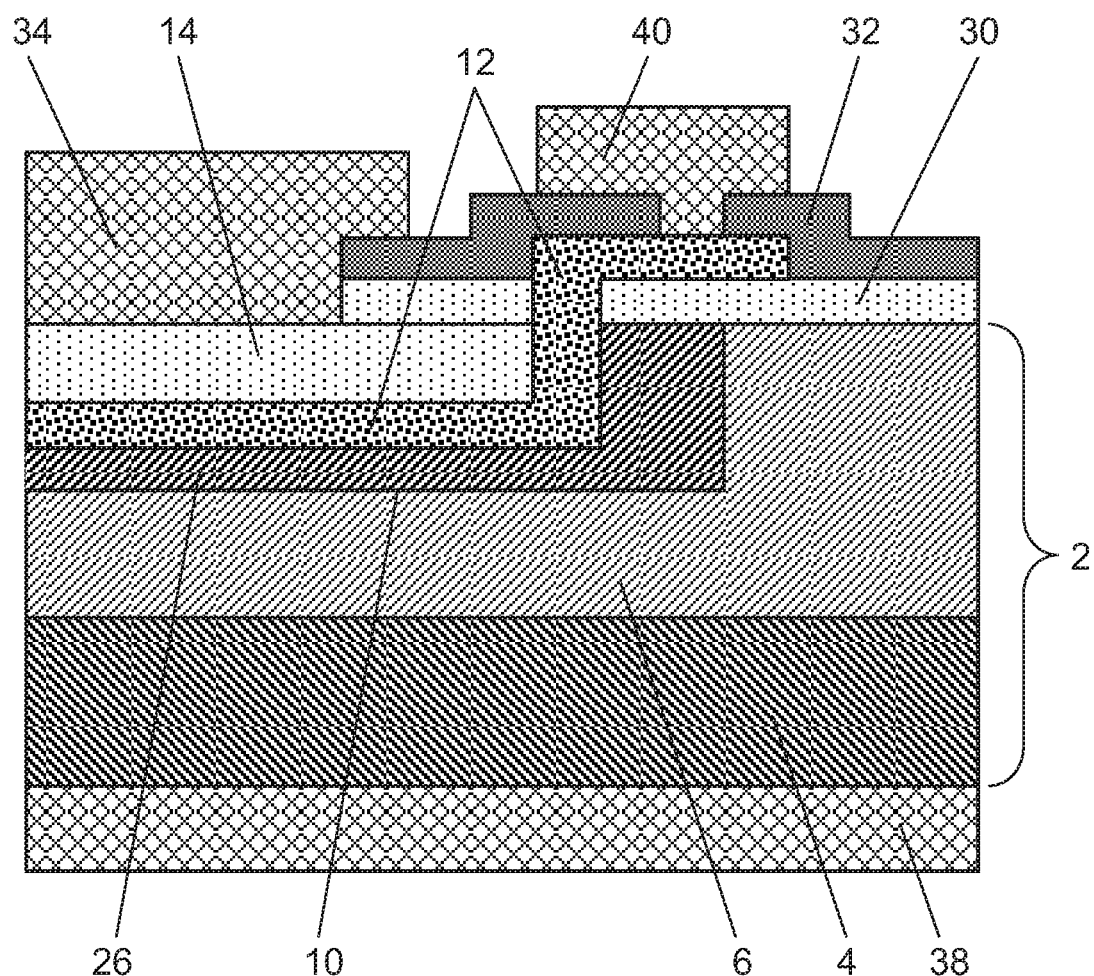
FIG. 4 is a cross-sectional view taken along line IV-IV' in FIG. 1.

FIG. 1 is a plan view illustrating a vertical gate semiconductor device according to an example of the present disclosure. FIG. 2 is a cross-sectional view illustrating the vertical gate semiconductor device according to the present disclosure, taken along line II-IF in the plan view of FIG. 1. FIG. 3 is a cross-sectional view illustrating the vertical gate semiconductor device according to the present disclosure, taken along line III-III' in the plan view of FIG. 1. FIG. 4 is a cross-sectional view illustrating the vertical gate semiconductor device according to the present disclosure, taken along line IV-IV' in the plan view of FIG. 1.

As illustrated in FIG. 1, the vertical gate semiconductor device according to this exemplary embodiment includes source terminal 34, gate terminal 36, back gate terminal 40, gate electrodes 22, and back gate electrodes 12. Source terminal 34, gate terminal 36, and back gate terminal 40 are disposed on substrate 2. A part of gate electrodes 22 and a part of back gate electrodes 12 are implanted in substrate 2. In FIG. 1, gate electrodes 22 and back gate electrodes 12 are shown for the purpose of explanation.

As illustrated in FIG. 2, the vertical gate semiconductor device according to this exemplary embodiment includes drift area 6 formed in substrate 2. Drift area 6 is disposed on semiconductor substrate 4 that is an N-type drain area, and is constituted by an N-type impurity area having a concentration lower than a concentration of semiconductor substrate 4. Body area 26, which is constituted by a P-type impurity area having a concentration higher than the concentration of N-type drift area 6, is provided on N-type drift area 6. Body area 26 is located at a position shallower than a position of N-type drift area 6. Source area 28, which is constituted by an N-type impurity area having a concentration higher than the concentration of body area 26, is provided on P-type body area 26. Source area 28 is located at a position shallower than the position of body area 26. Second trenches 18 extend from a front surface of substrate 2, which is constituted by drift area 6, body area 26, and source area 28, penetrate body area 26, and reach drift area 6. Gate insulation film 20 is formed on an inner surface of each of second trenches 18. Gate electrode 22 formed of N-type-doped polysilicon is implanted into each of second trenches 18, and covered by gate cap oxide film 24. Body area 26 is electrically separated from semiconductor substrate 4, source area 28, and gate electrodes 22.

First trenches 10 formed in body area 26 extend from the front surface of substrate 2, which is constituted by drift area 6, body area 26, and source area 28, and reach body area 26. Back gate electrode 12 is implanted into each of first trenches 10 at a position not adjacent to source area 28, and covered by back gate cap oxide film 14. Each of back gate electrodes 12 is formed of P-type-doped polysilicon within body area 26, and has a sheet resistance lower than a sheet resistance of body area 26. Each of second trenches 18 is sandwiched between first trenches 10. Silicon oxide film 30 and interlayer insulation film 32 are formed on the front surface of substrate 2. Contacts formed in an area including source area 28, first trenches 10, and second trenches 18 are connected with source terminal 34. Drain terminal 38 is formed on a rear surface of substrate 2.

According to the vertical gate semiconductor device of this exemplary embodiment, gate electrode 22, which is implanted into each of second trenches 18 and formed of N-type-doped polysilicon, is formed to reach the front surface of substrate 2, and connected with gate terminal 36 via contacts (through halls) formed in silicon oxide film 30 and interlayer insulation film 32 as illustrated in FIG. 3.

According to the vertical gate semiconductor device of this exemplary embodiment, back gate electrode 12, which is implanted into each of first trenches 10 and formed of P-type-doped polysilicon, is formed to reach the front surface of substrate 2, and connected with back gate terminal 40 via contacts (through halls) formed in silicon oxide film 30 and interlayer insulation film 32 as illustrated in FIG. 4.

An operation of the vertical gate semiconductor device according to this exemplary embodiment is hereinafter described.

Initially, a positive voltage with respect to source terminal 34 (in a range from 4V to 16V, for example) is applied to drain terminal 38, a positive voltage of a first threshold (such as 1V) or higher with respect to source terminal 34 is applied to gate terminal 36, and a voltage equivalent to a voltage of source terminal 34 (such as 0V) is applied to back gate terminal 40. In this case, electrons are induced in the vicinity of each gate insulation film 20 facing gate electrode 22, whereby electric conduction between drift area 6 and source area 28 is established. As a result, the vertical gate semiconductor device is brought into an ON state, and a current flows from drain terminal 38 to source terminal 34. When the voltage equivalent to the voltage of source terminal 34 is applied to gate terminal 36 and back gate terminal 40 in a state that a positive voltage with respect to source terminal 34 is applied to drain terminal 38, no current flows under an OFF state of the vertical gate semiconductor device produced in this condition. When the positive voltage with respect to source terminal 34 to be applied to drain terminal 38 is raised in this condition, reverse bias is applied to drift area 6 and body area 26. In this case, breakdown in excess of a withstand voltage occurs at the time of excess of critical electrical field strength.

Subsequently, a positive voltage with respect to drain terminal 38 (in a range from 4V to 16V, for example) is applied to source terminal 34, a positive voltage of a second threshold (such as 1V) or higher with respect to drain terminal 38 is applied to gate terminal 36, and a voltage equivalent to a voltage of drain terminal 38 (such as 0V) is applied to back gate terminal 40. In this case, electrons are induced in the vicinity of gate insulation film 20 facing each gate electrode 22, whereby electric conduction between source area 28 and drift area 6 is established. As a result, the vertical gate semiconductor device is brought into the ON state, and a current flows from source terminal 34 to drain terminal 38. When the voltage equivalent to the voltage of drain terminal 38 is applied to gate terminal 36 and back gate terminal 40 in a state that a positive voltage with respect to drain terminal 38 is applied to source terminal 34, no current flows under the OFF state of the vertical gate semiconductor device produced in this condition. When the positive voltage with respect to drain terminal 38 to be applied to source terminal 34 is raised in this condition, reverse bias is applied to source area 28 and body area 26. In this case, breakdown in excess of a withstand voltage occurs at the time of excess of critical electrical field strength. According to the present disclosure, back gate electrodes 12 having an impurity concentration higher than the impurity concentration of body area 26 are disposed at positions not adjacent to source area 28. Moreover, source area 28 and each of back gate electrodes 12 are disposed apart from each other with a clearance sufficient for preventing a breakdown phenomenon caused between source area 28 and back gate electrode 12 even when a maximum operation voltage is applied between source terminal 34 and drain terminal 38. Therefore, the semiconductor device provided according to this exemplary embodiment has a preferable breakdown voltage.

Voltages applied to the respective terminals are not limited to the specific voltages disclosed herein, but may be arbitrarily determined in accordance with sizes of respective parts of the semiconductor device, doping amounts of impurities, and other conditions.

FIGS. 5A through 7B are cross-sectional views sequentially illustrating steps executed in a forming process of the vertical gate semiconductor device having the foregoing structure. FIGS. 5A through 7B are schematic views similarly to FIG. 2, and therefore dimensional ratios of respective parts illustrated in these figures do not necessarily coincide with practical dimensional ratios.

Figure 5A:
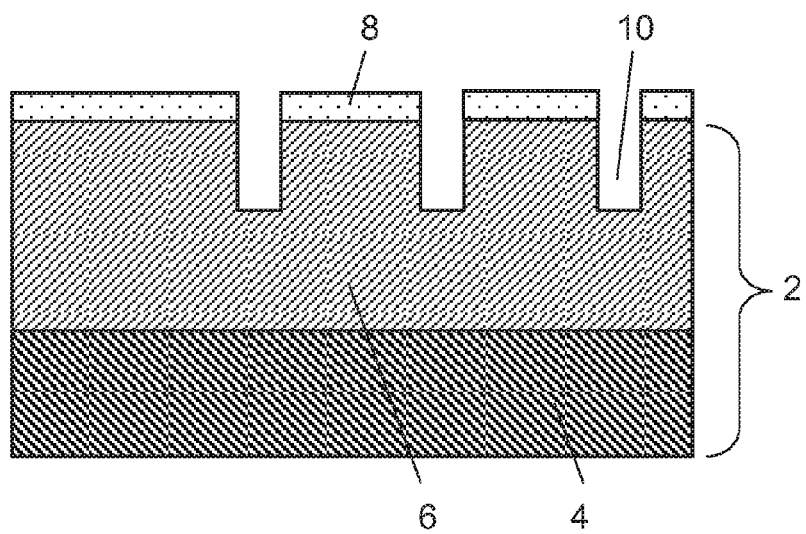
FIG. 5A, FIG. 5B, and FIG. 5C are cross-sectional views illustrating a manufacturing process of the semiconductor device according to the first exemplary embodiment.

As illustrated in FIG. 5A, N-type drift area 6 having a concentration lower than a concentration of N-type semiconductor substrate 4 is initially formed on N-type semiconductor substrate 4 by epitaxial growth. Then, silicon oxide film 8 having a film thickness in a range from 200 nm to 1,000 nm is formed on a surface of drift area 6 by thermal oxidation. A resist pattern is formed on silicon oxide film 8 by a lithography technique. This resist pattern has openings in areas where first trenches 10 will be formed in a later step. Silicon oxide film 8 formed on the areas of first trenches 10 is removed by etching with a mask of the resist pattern. After removal of the resist pattern, first trenches 10 reaching body area 26 are formed by etching with a mask of patterned silicon oxide film 8.

Figure 5B:
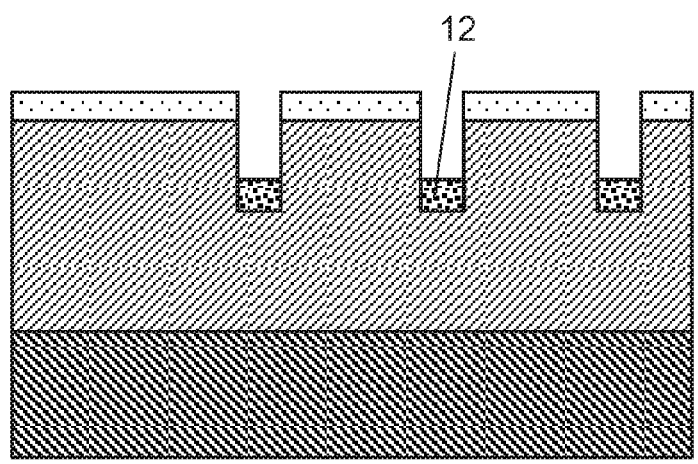

As illustrated in FIG. 5B, a natural oxide film formed on an inner surface of each of formed first trenches 10 is etched. A non-doped polysilicon film is deposited on the front surface of substrate 2 and within first trenches 10. Ions of boron approximately at $1.0 \times 10^{16}$ cm$^{-3}$ are implanted on the entire surface to diffuse boron into the non-doped polysilicon film by heat treatment. After a resist pattern for covering a back gate polysilicon wiring forming area such as back gate lead wiring is formed, the polysilicon on silicon oxide film 8 and a portion of the polysilicon within first trenches 10 are removed by polysilicon film etching to form back gate electrodes 12. By this polysilicon etching, an upper surface of each of back gate electrodes 12 is removed by etching to a position not adjacent to source area 28 which will be formed in a later step.

While non-doped polysilicon has been implanted and deposited within first trenches 10 in the present disclosure, P-type-doped polysilicon may be deposited. In addition, while a natural oxide film formed on the inner surface of each of first trenches 10 has been particularly etched in the present disclosure, other methods may be employed. For example, after formation of an oxide film on the inner surface of each of first trenches 10 by thermal oxidation or other methods, only the oxide film formed on a surface of a bottom portion of each of first trenches 10 may be removed without removal of the oxide film formed on a side surface of each of first trenches 10 by anisotropic etching to increase a length of each of back gate electrodes 12. In this case, the breakdown voltage improves based on insulation between source area 28 and back gate electrodes 12 via the oxide film. Moreover, a cross-sectional area of each of back gate electrodes 12 increases, and thus a resistance of each of back gate electrodes 12 decreases. Accordingly, a potential of the body area is stabilized, and thus reduction of an ON-resistance, improvement of avalanche withstand, and a high-speed operation are achievable.

Figure 5C:
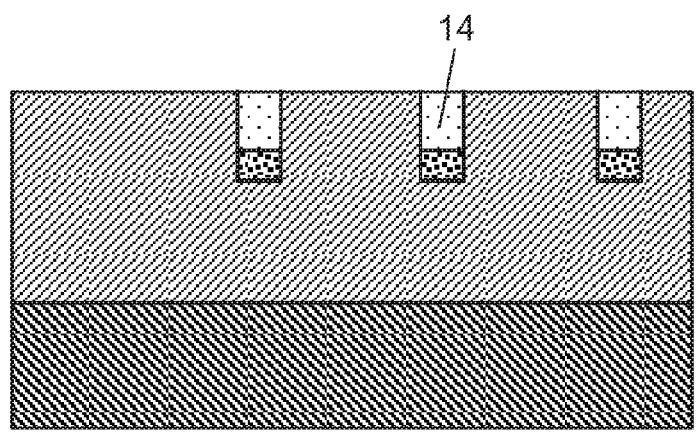

As illustrated in FIG. 5C, back gate cap oxide film 14 is formed on the front surface of substrate 2 and back gate electrodes 12 by a CVD (Chemical Vapor Deposition) technique. Then, the front surface of substrate 2 is flattened by an etch-back technique.

Figure 6A:
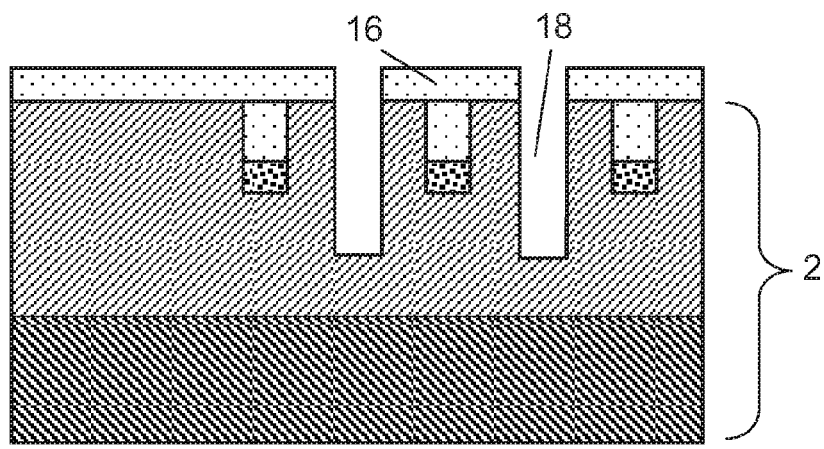
FIG. 6A, FIG. 6B, and FIG. 6C are cross-sectional views illustrating the manufacturing process of the semiconductor device according to the first exemplary embodiment.

As illustrated in FIG. 6A, silicon oxide film 16 having a film thickness in a range from 50 nm to 500 nm is formed on the front surface of substrate 2. A resist pattern is formed on silicon oxide film 16 by a lithography technique. This resist pattern has openings in areas where second trenches 18 will be formed in a later step. Silicon oxide film 16 formed on the areas of second trenches 18 is removed by etching with a mask of the resist pattern. After removal of the resist pattern, second trenches 18 are formed by dry etching with a mask of patterned silicon oxide film 16.

Figure 6B:
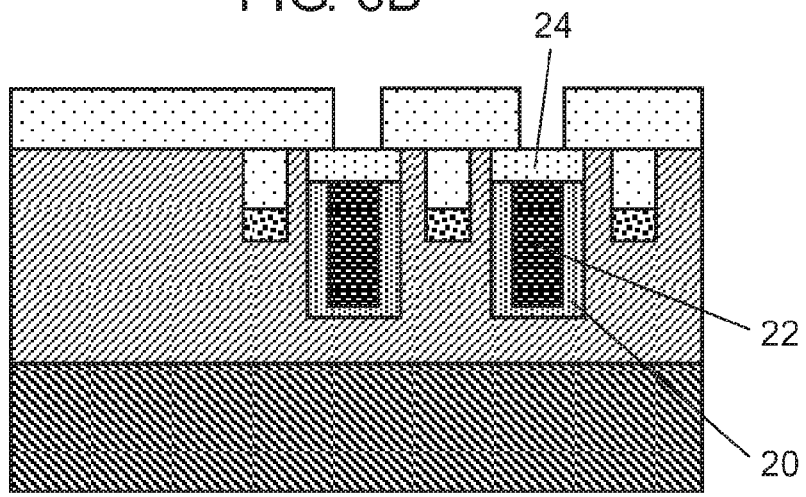

As illustrated in FIG. 6B, gate insulation film 20 having a film thickness in a range from 8 nm to 100 nm is formed on an inner surface of each of second trenches 18. After a conductive N-type polysilicon film in a range from 200 nm to 800 nm is deposited on substrate 2 and within second trenches 18, a resist pattern for covering a gate polysilicon wiring forming area such as gate lead wiring is formed. Subsequently, the polysilicon film formed on silicon oxide film 16 is removed by polysilicon film etching with a mask of this resist pattern to form gate electrodes 22. Thereafter, gate cap oxide film 24 is formed on the front surface of substrate 2 and gate electrodes 22 by a CVD technique.

Figure 6C:
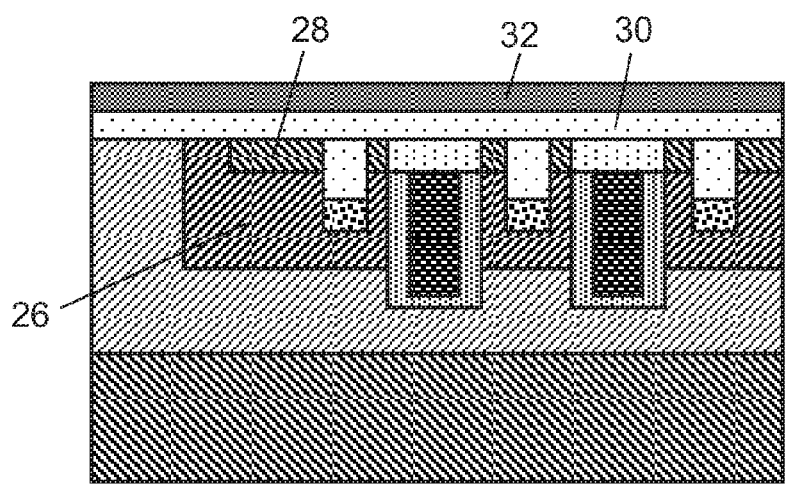

As illustrated in FIG. 6C, a resist pattern for covering an area other than body area 26 is formed after etching of the oxide film. Then, ions of boron are implanted to form body area 26. After a resist pattern for covering an area other than source area 28 is formed, ions of phosphorus are implanted to form source area 28. Then, silicon oxide film 30 and interlayer insulation film 32 are formed by a CVD method.

Figure 7A:
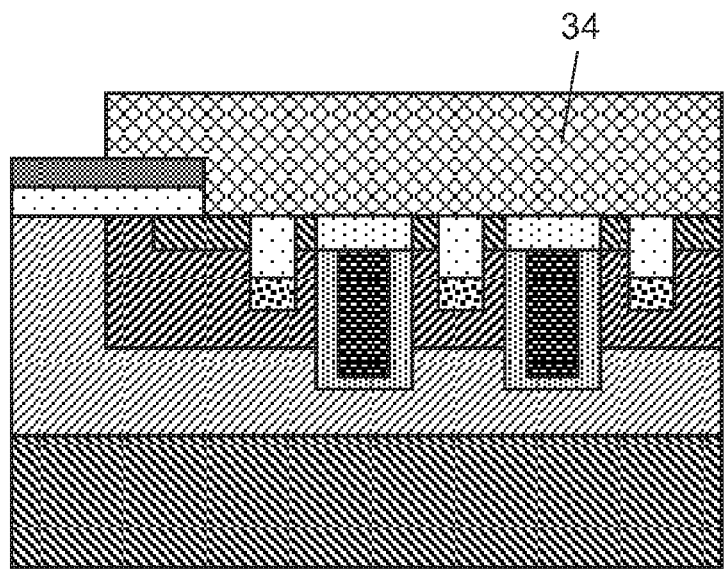
FIG. 7A and FIG. 7B are cross-sectional views illustrating the manufacturing process of the semiconductor device according to the first exemplary embodiment.

A resist pattern is formed on silicon oxide film 30 and interlayer insulation film 32. This resist pattern has openings at positions of areas where contacts with source terminal 34, gate terminal 36, and back gate terminal 40 will be formed. Contacts with the source, gate, and back gate are formed by etching as illustrated in FIG. 7A. After formation of a conductive film for electric connection, a resist pattern is formed on areas where source terminal 34, gate terminal 36, and back gate terminal 40 will be formed. Then, source terminal 34, gate terminal 36, and back gate terminal 40 are formed by etching.

Figure 7B:
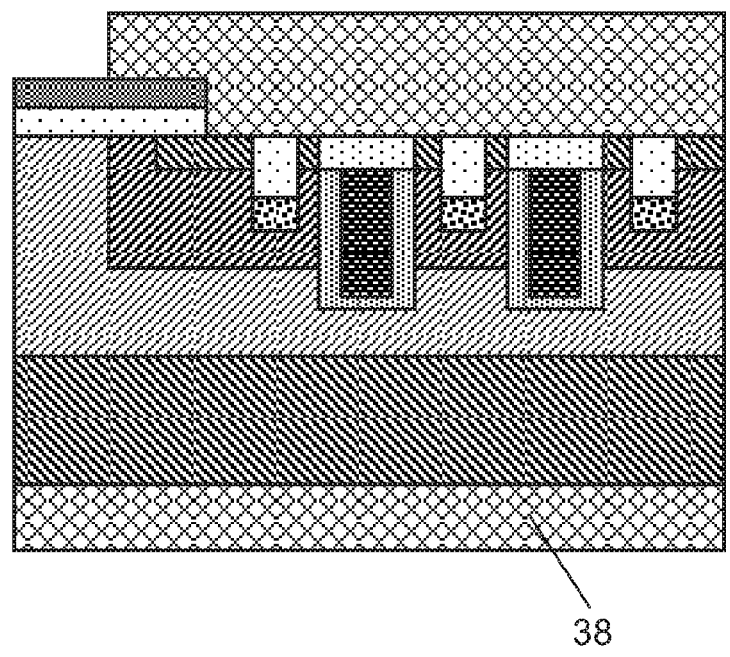

After the rear surface of substrate 2 is polished, a conductive film for electric connection is formed on the rear surface of substrate 2. Then, drain terminal 38 is formed as illustrated in FIG. 7B.

According to the vertical gate semiconductor device of the present disclosure, back gate electrodes 12 are disposed apart from source area 28. Therefore, the semiconductor device provided according to the present disclosure has a preferable bidirectional breakdown voltage. Moreover, each of back gate electrodes 12 is formed of P-type-doped polysilicon. In this case, the sheet resistance of back gate electrodes 12 decreases in comparison with back gate electrode 12 formed by impurity diffusion. Accordingly, the potential of the body area is stabilized, and thus reduction of the ON-resistance, improvement of avalanche withstand, and a high-speed operation are achievable.

Second Exemplary Embodiment

Figure 8:
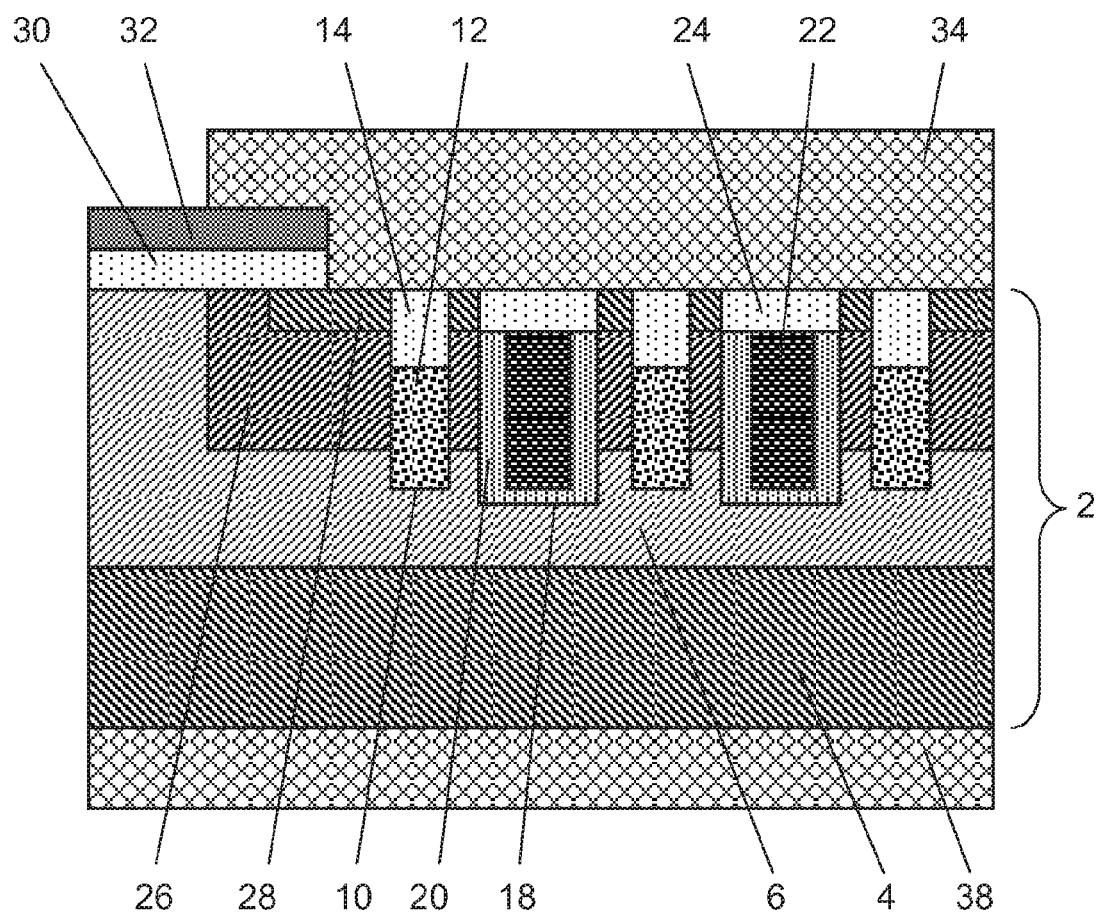
FIG. 8 is a cross-sectional view illustrating a configuration of a semiconductor device according to a second exemplary embodiment.

FIG. 8 is a cross-sectional view illustrating a vertical gate semiconductor device according to a second exemplary embodiment of the present disclosure.

As illustrated in FIG. 8, first trenches 10 and back gate trenches 12 of the vertical gate semiconductor device according to this exemplary embodiment reach drift area 6. Each of back gate electrodes 12 extends over body area 26 and drift area 6.

A manufacturing method according to this exemplary embodiment is similar to the manufacturing method of the first exemplary embodiment. Formation of this exemplary embodiment is practiced based on time adjustments of respective steps.

According to the vertical gate semiconductor device of the present disclosure described in this exemplary embodiment includes first trenches 10 and back gate electrodes 12 reaching drift area 6. In this case, a cross-sectional area of each of back gate electrodes 12 increases, and thus a resistance of each of back gate electrodes 12 further decreases. Accordingly, further reduction of the ON-resistance, improvement of avalanche withstand, and a high-speed operation are achievable.

Third Exemplary Embodiment

Figure 9:
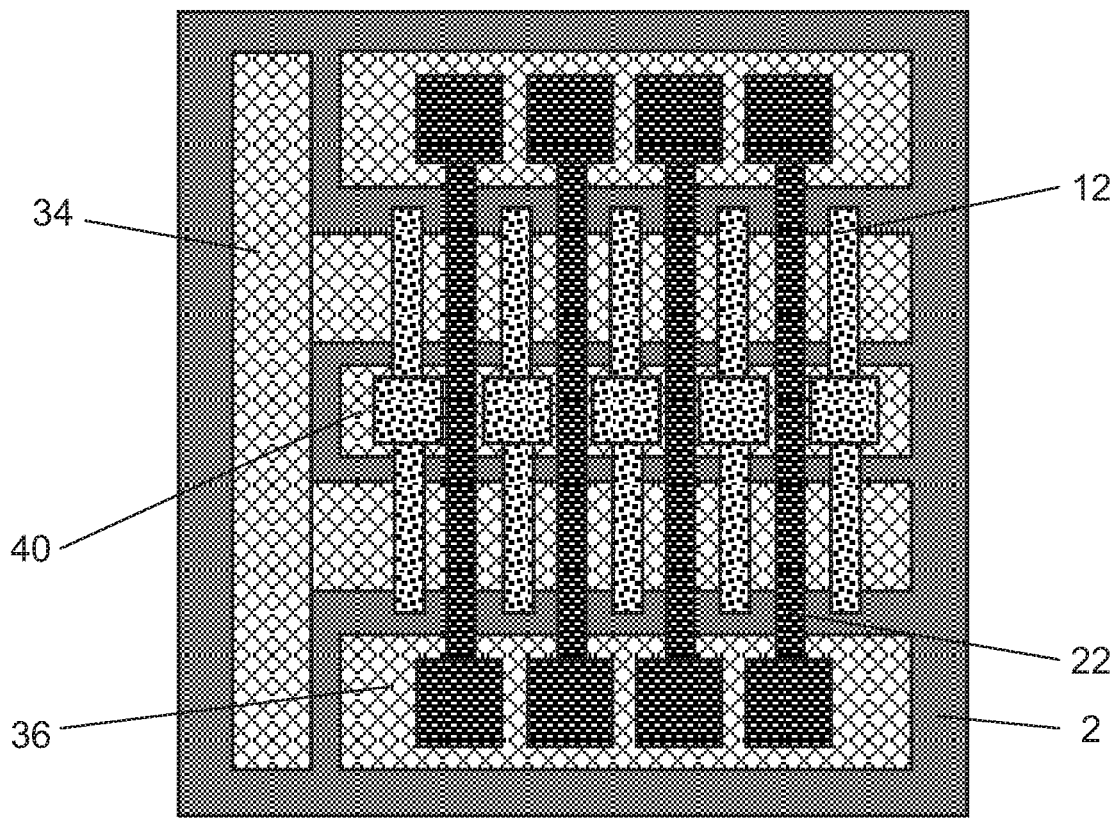
FIG. 9 is a plan view illustrating a configuration of a semiconductor device according to a third exemplary embodiment.

FIG. 9 is a plan view illustrating a vertical gate semiconductor device according to a third exemplary embodiment of the present disclosure.

As illustrated in FIG. 9, the vertical gate semiconductor device according to this exemplary embodiment includes source terminal 34, gate terminals 36, back gate terminal 40, gate electrodes 22, and back gate electrodes 12. Source terminal 34, gate terminal 36, and back gate terminal 40 are disposed on substrate 2. A part of gate electrodes 22 and a part of back gate electrodes 12 are implanted in substrate 2. In FIG. 9, gate electrodes 22 and back gate electrodes 12 are shown for the purpose of explanation.

Back gate electrodes 12 are connected with back gate terminal 40 via contacts. When a voltage is applied to back gate terminal 40, back gate electrodes 12 are sequentially driven from a near end corresponding to a contact position to a far end of each of back gate electrodes 12. A voltage driving distance of back gate electrodes 12 driven by this voltage corresponds to a distance from the near end to the far end. When gate electrodes 22 are connected with gate terminals 36 at a plurality of points via contacts as illustrated in FIG. 9, gate electrodes 22 are simultaneously driven from all contact points in a direction from a near end to a far end. In this case, the far end corresponds to an intermediate point between adjoining contacts, while a voltage driving distance corresponds to a half of a distance between the adjoining contacts.

According to the vertical gate semiconductor device of this exemplary embodiment illustrated in FIG. 9, the voltage driving distance of back gate electrodes 12 is shorter than the voltage driving distance of gate electrodes 22. In this case, back gate electrodes 12 are driven at a higher speed than a driving speed of gate electrodes 22, and thus the potential of body area 26 is stabilized. Accordingly, reduction of the ON-resistance, improvement of avalanche withstand, and a high-speed operation are achievable.

Fourth Exemplary Embodiment

Figure 10:
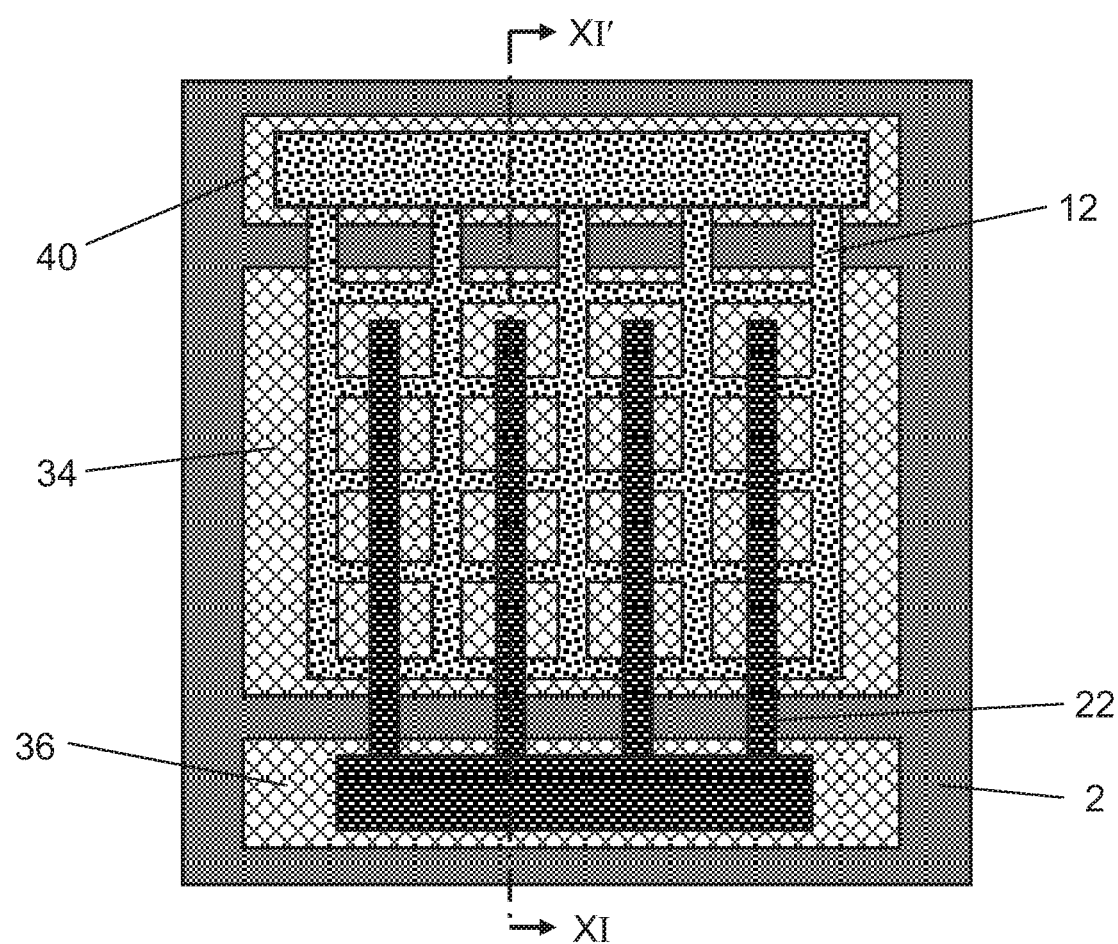
FIG. 10 is a plan view illustrating a configuration of a semiconductor device according to a fourth exemplary embodiment.
Figure 11:
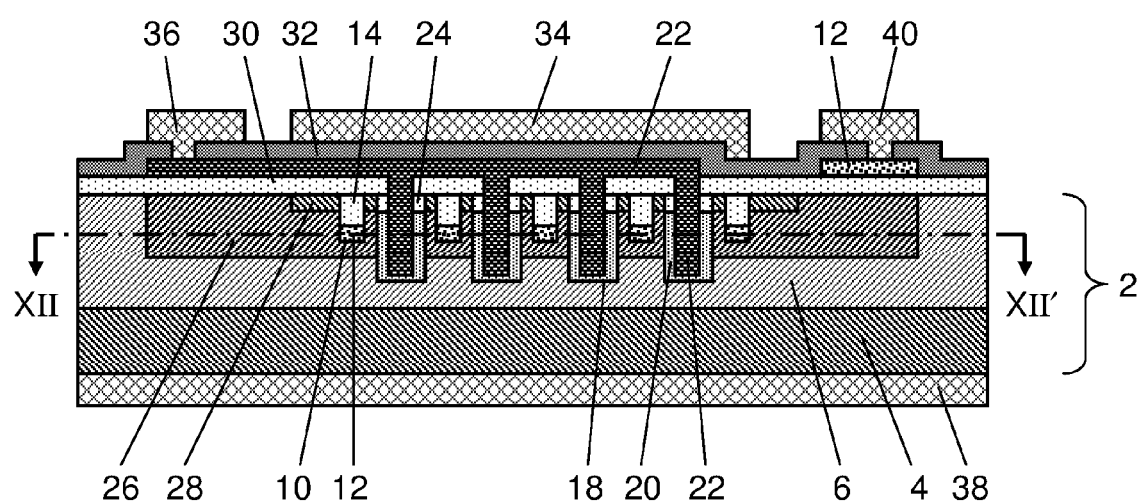
FIG. 11 is a cross-sectional view taken along line XI-XI' in FIG. 10.
Figure 12:
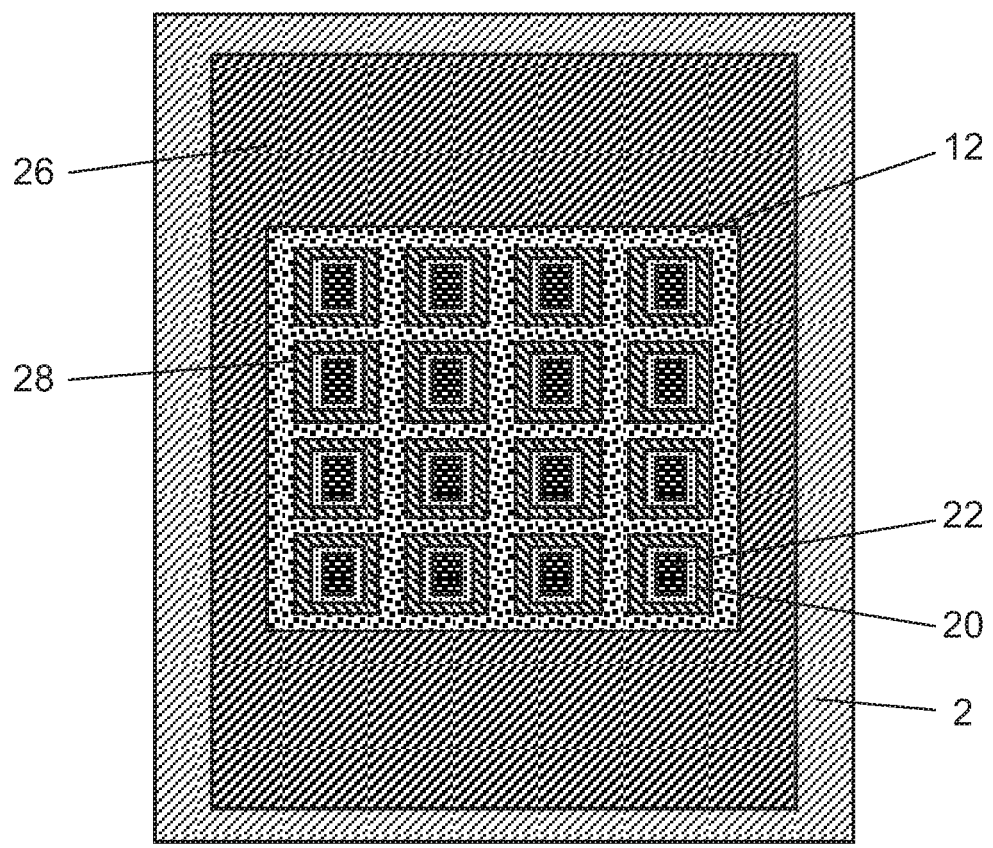
FIG. 12 is a plan view taken along line XII-XII' in FIG. 11.

FIG. 10 is a plan view illustrating a vertical gate semiconductor device according to a fourth exemplary embodiment of the present disclosure. FIG. 11 is a cross-sectional view of the vertical gate semiconductor device according to the fourth exemplary embodiment of the present disclosure, taken along line XI-XI' in FIG. 10. FIG. 12 is a plan view of the vertical gate semiconductor device according to the fourth exemplary embodiment of the present disclosure, taken along line XII-XII' in FIG. 11.

As illustrated in FIG. 10, the vertical gate semiconductor device according to this exemplary embodiment includes source terminal 34, gate terminal 36, back gate terminal 40, gate electrodes 22, and back gate electrodes 12. Source terminal 34, gate terminal 36, and back gate terminal 40 are disposed on substrate 2. A part of gate electrodes 22 and a part of back gate electrodes 12 are implanted in substrate 2. In FIG. 10, gate electrodes 22 and back gate electrodes 12 are shown for the purpose of explanation.

As illustrated in FIGS. 10 through 12, the vertical gate semiconductor device according to this exemplary embodiment is different from the vertical gate semiconductor device of the first exemplary embodiment in arrangement of gate electrodes 22 and back gate electrodes 12. According to the vertical gate semiconductor device of this exemplary embodiment, gate electrodes 22 are surrounded by back gate electrodes 12. This arrangement of back gate electrodes 12 further stabilizes the potential of body area 26 around gate electrodes 22, and thus improvement of avalanche withstand, and a high-speed operation are achievable.

Fifth Exemplary Embodiment

Figure 13:
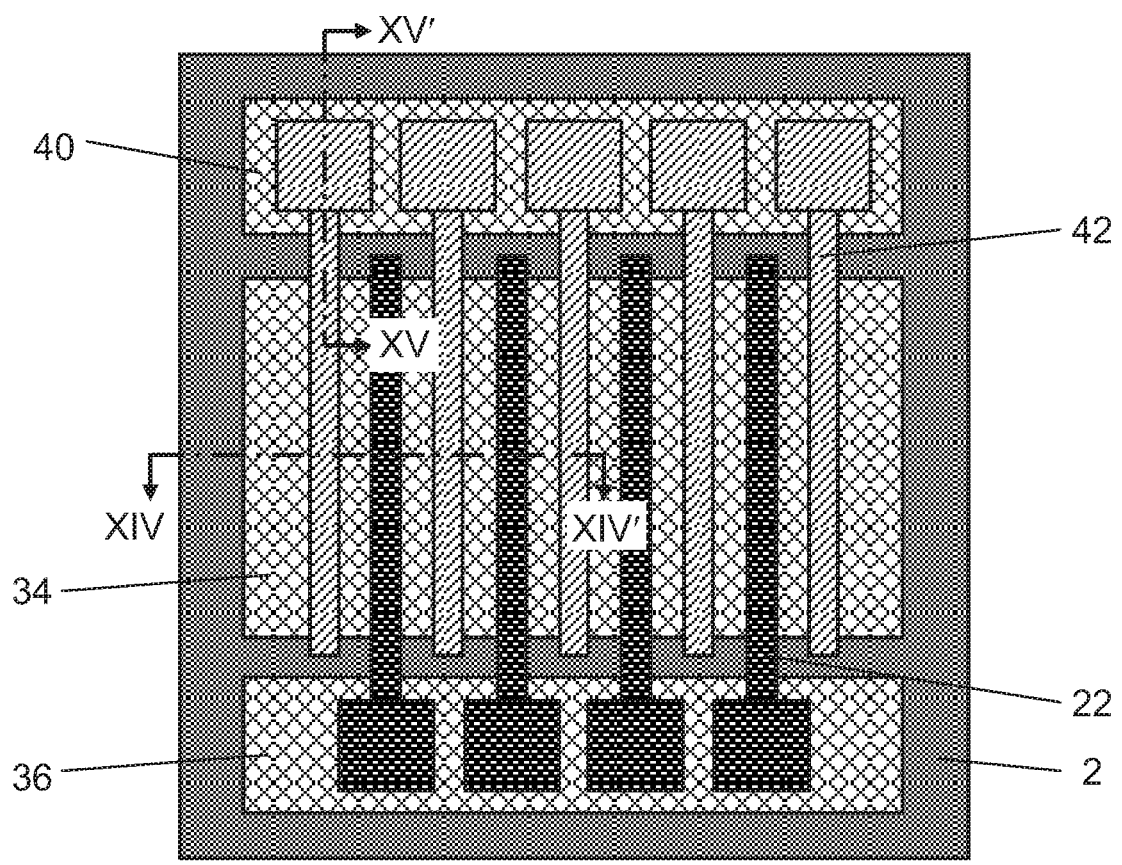
FIG. 13 is a plan view illustrating a configuration of a semiconductor device according to a fifth exemplary embodiment.
Figure 14:
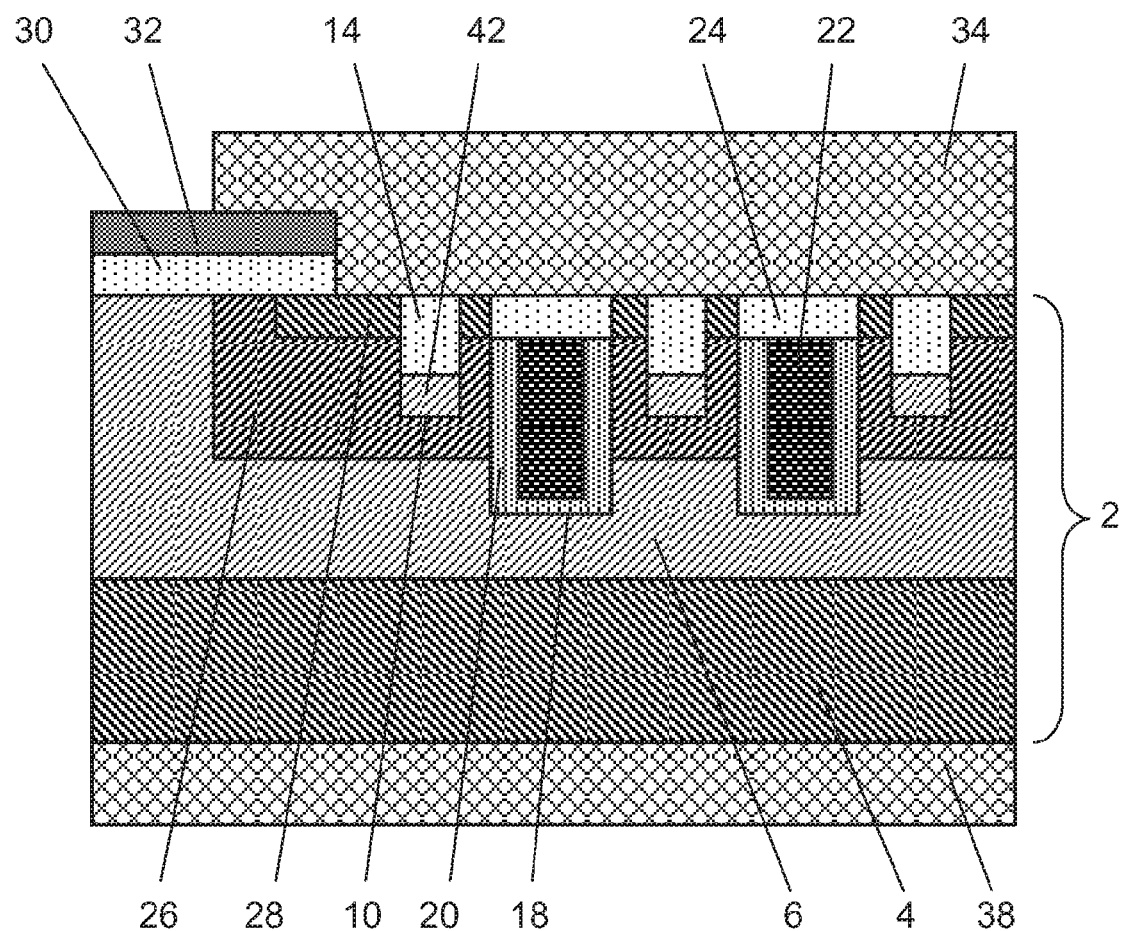
FIG. 14 is a cross-sectional view taken along line XIV-XIV' in FIG. 13.
Figure 15:
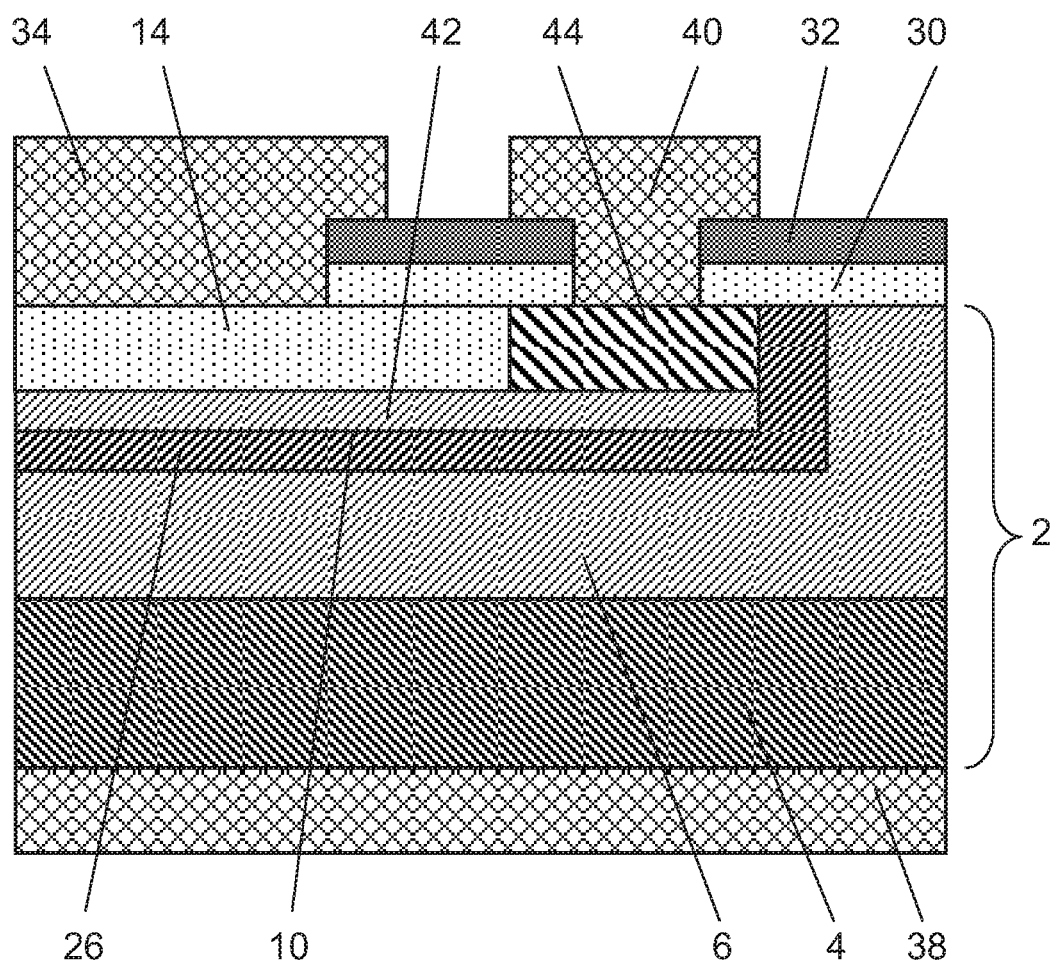
FIG. 15 is a cross-sectional view taken along line XV-XV' in FIG. 13.

FIG. 13 is a plan view illustrating a vertical gate semiconductor device according to a fifth exemplary embodiment of the present disclosure. FIG. 14 is a cross-sectional view of the vertical gate semiconductor device according to the fifth exemplary embodiment of the present disclosure, taken along line XIV-XIV' in FIG. 13. FIG. 15 is a cross-sectional view of the vertical gate semiconductor device according to the fifth exemplary embodiment of the present disclosure, taken along line XV-XV' in FIG. 13.

As illustrated in FIG. 13, the vertical gate semiconductor device according to this exemplary embodiment includes source terminal 34, gate terminal 36, back gate terminal 40, gate electrodes 22, and P+ back gate electrodes 42. Source terminal 34, gate terminal 36, and back gate terminal 40 are disposed on substrate 2. A part of gate electrodes 22 and a part of P+ back gate electrodes 42 are implanted in substrate 2. In FIG. 13, gate electrodes 22 and P+ back gate electrodes 42 are shown for the purpose of explanation.

As illustrated in FIG. 14, the vertical gate semiconductor device according to this exemplary embodiment includes P+ back gate electrodes 42 each of which is constituted by a P-type impurity area.

As illustrated in FIG. 15, the vertical gate semiconductor device according to this exemplary embodiment includes back gate contact electrodes 44 each of which is constituted by a P-type impurity area for electric conduction between P+ back gate electrodes 42 and back gate terminal 40.

P+ back gate electrodes 42 are formed by ion implantation of boron and thermal diffusion after formation of first trenches. For forming back gate contact electrodes 44, it is initially executed before formation of the first trenches to form a resist pattern having openings in areas where back gate contact electrodes 44 will be formed in a later step. Then, ions of boron are implanted with a mask of this resist pattern, and then back gate contact electrodes 44 are formed by thermal diffusion.

The presence of P+ back gate electrodes 42 further stabilizes the potential of body area 26 around gate electrodes 22, and thus improvement of avalanche withstand, and a high-speed operation are achievable.

The first through fifth exemplary embodiments have been described by way of examples of the technology disclosed in the present application. However, the technology according to the present disclosure is not limited to these exemplary embodiments, but may be applied to exemplary embodiments in which modifications, replacements, additions, omissions and the like are appropriately made.

The respective exemplary embodiments and modified examples have been described by way of examples of the technology according to the present disclosure. The accompanying drawings and the detailed description have been presented only for this purpose.

Accordingly, respective constituent elements described and depicted in the detailed explanation and accompanying drawings may include not only constituent elements essential to solutions to problems, but also constituent elements presented only by way of example of the technology and not essential to solutions to problems. It should not be immediately considered that the constituent elements other than the essential elements are essential only based on the fact that the constituent elements other than the essential elements are described or depicted in the detailed description or accompanying drawings.

The respective exemplary embodiments have been presented only by way of example of the technology in the present disclosure, and thus various modifications, replacements, additions, omissions or the like may be made without departing from the scope of the appended claims or equivalents.

What is claimed is:

1. A semiconductor device comprising:
   a first conductivity type semiconductor substrate to be a drain area;
   a drift area formed on the drain area;
   a second conductivity type body area formed on an upper portion of the drift area;
   a first conductivity type source area formed on an upper portion of the body area;
   a trench that penetrates the source area and the body area, and reaches the drift area;
   an insulation film formed on an inner wall of the trench;
   a gate electrode formed inside the insulation film; and
   a second conductivity type back gate electrode formed inside the body area and electrically connected with the body area,
   wherein:
   a current flows from the drain area to the source area in a state where a first voltage is applied to the drain area, a second voltage lower than the first voltage is applied to the source area and the body area, and a third voltage equal to or higher than a first threshold is applied between the gate electrode and the source area,
   a current flows from the source area to the drain area in a state where the first voltage is applied to the source area, the second voltage is applied to the drain area and the body area, and a fourth voltage equal to or higher than a second threshold is applied between the gate electrode and the drain area,
   a sheet resistance of the back gate electrode is lower than a sheet resistance of the body area, and
   the source area and the back gate electrode are disposed apart from each other with a clearance sufficient for preventing a breakdown phenomenon caused between the source area and the back gate electrode when a maximum operation voltage is applied between the source area and the drain area.

2. The semiconductor device according to claim 1, wherein an insulation film is formed between the back gate electrode and the source area.

3. The semiconductor device according to claim 1, wherein the back gate electrode is formed of polysilicon.

4. The semiconductor device according to claim 1, wherein the back gate electrode includes a diffusion layer.

5. The semiconductor device according to claim 1, wherein
   the back gate electrode is connected with a back gate terminal via a first contact,
   the gate electrode is connected with a gate terminal via a second contact, and
   a voltage driving distance of the back gate electrode driven from the first contact when a voltage is applied to the back gate terminal is shorter than a voltage driving distance of the gate electrode driven from the second contact when a voltage is applied to the gate terminal.

6. The semiconductor device according to claim 1, wherein the gate electrode is surrounded by the back gate electrode in a plan view.

7. The semiconductor device according to claim 1, wherein the back gate electrode extends over the body area and the drift area.

8. The semiconductor device according to claim 2, wherein the back gate electrode is formed of polysilicon.

9. The semiconductor device according to claim 2, wherein the back gate electrode includes a diffusion layer.

10. The semiconductor device according to claim 2, wherein
the back gate electrode is connected with a back gate terminal via a first contact,
the gate electrode is connected with a gate terminal via a second contact, and
a voltage driving distance of the back gate electrode driven from the first contact when a voltage is applied to the back gate terminal is shorter than a voltage driving distance of the gate electrode driven from the second contact when a voltage is applied to the gate terminal.

11. The semiconductor device according to claim 2, wherein the gate electrode is surrounded by the back gate electrode in a plan view.

12. The semiconductor device according to claim 2, wherein the back gate electrode extends over the body area and the drift area.

* * * * *